United States Patent
Graupera et al.

(10) Patent No.: US 8,759,764 B2
(45) Date of Patent: Jun. 24, 2014

(54) ON-AXIS DETECTOR FOR CHARGED PARTICLE BEAM SYSTEM

(75) Inventors: Anthony Graupera, Hillsboro, OR (US); N. William Parker, Hillsboro, OR (US); Mark W. Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 47 days.

(21) Appl. No.: 13/538,851

(22) Filed: Jun. 29, 2012

(65) Prior Publication Data
US 2014/0001357 A1    Jan. 2, 2014

(51) Int. Cl.
*H01J 37/256*      (2006.01)

(52) U.S. Cl.
CPC .................................. *H01J 37/256* (2013.01)
USPC ......................................... 250/310; 250/397

(58) Field of Classification Search
USPC ..................... 250/310, 397, 396 R
See application file for complete search history.

(56) References Cited

U.S. PATENT DOCUMENTS

| | | | |
|---|---|---|---|
| 6,084,238 A * | 7/2000 | Todokoro et al. | 250/310 |
| 6,476,390 B1 * | 11/2002 | Murakoshi et al. | 850/9 |
| 6,900,447 B2 | 5/2005 | Gerlach et al. | |
| 7,009,187 B2 | 3/2006 | Gerlach et al. | |
| 7,122,795 B2 * | 10/2006 | Parker | 250/310 |
| 7,262,418 B2 * | 8/2007 | Lo et al. | 250/396 R |
| 7,525,893 B2 * | 4/2009 | Tsukuda et al. | 369/101 |
| 8,076,650 B2 | 12/2011 | Smith et al. | |
| 8,168,961 B2 | 5/2012 | Straw et al. | |
| 8,278,220 B2 | 10/2012 | Holtermann et al. | |
| 8,283,629 B1 | 10/2012 | Tuggle et al. | |
| 8,314,410 B2 | 11/2012 | Straw et al. | |
| 8,405,054 B2 | 3/2013 | Smith et al. | |
| 2004/0151991 A1 | 8/2004 | Stewart et al. | |
| 2011/0115129 A1 | 5/2011 | Straw et al. | |
| 2011/0163068 A1 | 7/2011 | Utlaut et al. | |
| 2012/0103945 A1 | 5/2012 | Straw et al. | |
| 2012/0200007 A1 | 8/2012 | Straw et al. | |

FOREIGN PATENT DOCUMENTS

EP      2590203      5/2013

\* cited by examiner

*Primary Examiner* — Kiet T Nguyen
(74) *Attorney, Agent, or Firm* — Scheinberg & Assoc., PC; Michael O. Scheinberg (57) ABSTRACT

A split grid multi-channel secondary particle detector for a charged particle beam system includes a first grid segment and a second grid segment, each having independent bias voltages creating an electric field such that the on-axis secondary particles that are emitted from the target are directed to one of the grids. The bias voltages of the grids can be changed or reversed so that each grid can be used to detect the secondary particles and the multi-channel particle detector as a whole can extend its lifetime.

19 Claims, 13 Drawing Sheets

FIG. 1

*PRIOR ART*

PRIOR ART

FIG. 2

PRIOR ART

FIG. 3

PRIOR ART

FIG. 4

PRIOR ART

ON-AXIS DETECTOR FOR CHARGED PARTICLE BEAM SYSTEM

TECHNICAL FIELD OF THE INVENTION

The present invention relates generally to charged particle systems and in particular to increasing the detection efficiency for on-axis secondary particles.

BACKGROUND OF THE INVENTION

In a charged particle beam system, a focusing column is typically used to focus a charged particle beam onto the surface of a target to be imaged or processed using the beam. A charged particle beam system can be, for example, an electron microscope or a focused ion beam system. To form an image of the target using scanning ion microscopy or scanning electron microscopy, the beam is deflected across the target surface, usually in a raster pattern. Due to the impact of the charged particle beam with the target, secondary particles are emitted and may be collected to form an imaging signal. The primary charged particle beam, that is, the beam that impacts the target, can be an electron beam or a focused ion beam.

An electron beam will generally stimulate the emission of secondary electrons from a target. A focused ion beam will stimulate the emission from a target of both secondary electrons and secondary ions, mostly positively-charged. Secondary particles are comprised of either secondary electrons, secondary ions, or a combination of secondary electrons and secondary ions. Secondary particles are detected by a detector, such as a micro-channel plate ("MCP") also sometimes referred to as a "multi-channel plate," a scintillator photomultiplier (also known as an Everhardt-Thornley or "ET" detector), or a semiconductor detector.

An MCP detector has a large number of small channels that are impacted by the secondary electrons from the target. Each channel operates independently of the others, amplifying the incoming secondary particles by a process that cascades the multiplication of the secondary particles within each channel. This amplified current is then collected on one or more anodes positioned on the far side of the MCP (i.e., the opposite side from the side receiving the input signal current). Often, to avoid "ion feedback," that is, gas molecules in the MCP ionized by the electrons returning to impact the target, a two-stage structure is employed in which the channels in the first stage have a different angle than those in the second-stage, thereby eliminating "line-of-sight" travel of positive ions from the exit back to the entrance of the MCP (the so-called "chevron" configuration).

In a scintillator-photomultiplier detector, secondary electrons impact a scintillator, which gives off photons of light. A photomultiplier tube then converts the photons back to electrons, which are then amplified in a cascade process. In a solid state collector, each secondary electron is amplified by the creation of multiple electron-hole pairs in a semiconductor.

The detectors can have an annular shape concentric with the optical axis of the charged particle beam and a hole in the center to pass the particle beam. Alternatively, the detector can be "off axis." An electron detector is characterized by a collection efficiency, i.e., the fraction of emitted secondary particles from the target which are collected by the detector.

Figure 1:
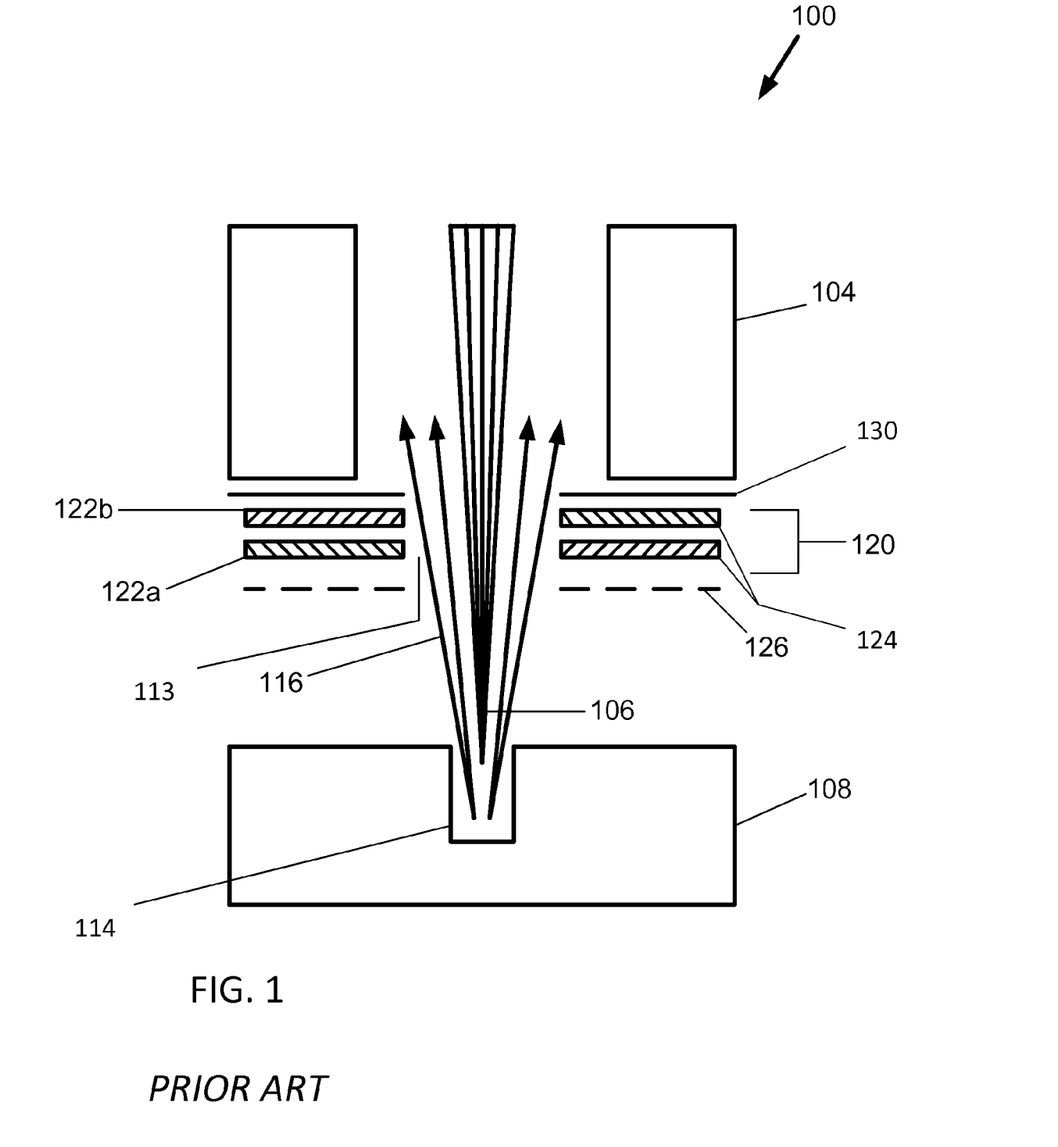
FIG. 1 shows schematically a prior art charged particle beam system that uses an MCP secondary electron detector.

FIG. 1 shows schematically a part of a prior art charged particle beam column 100. Charged particle column 100 includes a lens 104 that focuses a charged particle beam 106 onto the surface of a target 108. Due to the impact of charged particle beam 106 with target 108, secondary particles 116 are emitted from target 108. For the case where charged particle beam 106 is an electron beam, these secondary particles will be secondary electrons. For the case where charged particle beam 106 is a focused ion beam (FIB), both secondary electrons and secondary ions (mostly positive) may be emitted from the target 108. Generally, the angular intensity of the secondary particle emissions (in the case of a normally-incident primary charged particle beam 106), tends to follow a Lambert, or cosine distribution. The angular distribution of particles is concentrated around an axis perpendicular to the surface of target 108.

A microchannel plate detector 120 typically comprises two annular plates 122a and 122b, with the internal passages 124 of the two plates slanted in the opposite direction. Some detectors may include a single plate, while other detectors may include three or more plates. A grid 126 positioned between plate 122a and target 108 is maintained at a constant positive voltage to attract electrons from the target and to prevent positive secondary ions from entering and damaging the plates 122a and 122b. A collection anode 130 is positioned behind plate 122b to collect the amplified electron signal.

In one application called "circuit edit," a charged particle system allows product designers to reroute conductive pathways of an integrated circuit and test the modified circuit in hours, rather than the weeks or months that would be required to generate new masks and process new wafers. Fewer, shorter modification and test cycles allow manufacturers to ramp new processes to faster, profitable, high volume yields, and be first to market with premium priced new products.

Circuit edit can involve milling a hole using the focused ion beam to sever a buried conductor or to deposit conductive material in order to create a new conductor that connects components. Circuit edit often requires producing high aspect ratio holes, that is, a hole that is deeper than it is wide. When milling a hole to connect two circuit layers or to sever a buried conductor, the operator must determine the correct time to stop milling to avoid milling past the desired layer. Determining when to stop, referred to as "endpointing," often relies on observing the milling process using secondary particles. It is difficult to form an image of the bottom of a high aspect ratio hole because the few secondary particles that escape the hole do not impact the detector, thus making it difficult to determine when the desired hole depth is achieved.

SUMMARY OF THE INVENTION

An object of the invention is to improve the collection efficiency of an on-axis secondary particle detector.

An electric or magnetic field is provided that changes the trajectory of secondary particles such that the secondary particles impact the detector rather than pass through the annular hole in the on-axis detector, thereby increasing the detection efficiency. In some embodiments, the field can also spread the secondary particles more evenly across a portion of the detector to reduce the concentration of particles on the detector near the axis, thereby extending the life of the detector. In some embodiments, the electric or magnetic field can be altered or reversed to extend the life of the detector by causing the secondary particles to impact onto different regions of the detector.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention include a system that alters the trajectories of charged secondary particles coming from the target so that the secondary particles impact the detector rather than entering the hole in the center of an on-axis detector. In one embodiment, a segmented grid is positioned between the target and the detector. An electrical potential difference between segments of the grid creates an electric field having a component normal to the optical axis of the charged particle beam focusing column. The electric field shifts the particle trajectories away from the hole in the detector so that the secondary particles do not enter the on-axis hole of the detector and do not avoid detection. In other embodiments, a magnetic field can be used to deflect the secondary particles away from the hole in the detector. The detector can be, for example, an MCP detector, a semiconductor detector, or a scintillator-photomultiplier. The detector has the ability to detect secondary ions as well as secondary electrons.

The angular emission distribution of the secondary particles follows a cosine distribution, with the maximum number of secondary particles emitted upwards from the target. By deflecting the secondary charged particles away from the center hole, the collection efficiency of the secondary particles is increased dramatically. The emission of secondary particles from a high aspect ratio hole is often concentrated more around the primary beam axis, because particles emitted at significant angles from the bottom of the hole collide with the walls of the hole and do not reach the detector. Relatively few particles leave the high aspect ratio (HAR) holes; and those that do leave the hole pass through the on-axis hole in the detector, which makes imaging the bottom of a high aspect ratio hole difficult. The problem is exacerbated at low primary beam currents, which further reduces the secondary particle emission. Deflecting the particles away from the hole in the detector allows for the optimization of the overall collection efficiency to almost 100%. This allows for vastly improved endpoint detection, especially at sub-pA beam currents.

In some embodiments, each segment of the grid has an independent voltage supply so that the voltages on the segments can be set independently and varied. While the grid is segmented in some embodiments, the detector itself need not be segmented, that is, the detector can be, for example, a single annulus that does not differentiate where on the annulus the particle impacts. In other embodiments, the detector itself can be segmented and the segments can be electrically biased to provide a field to deflect the secondary particles.

In some embodiments, a charged particle beam system comprises a vacuum chamber that contains a source of charged particles, a focusing column for focusing a charged particle beam, a target stage for holding a target to which the charged particle beam can be applied, an on-axis detector, and a source of a field to cause secondary particles to impact the detector rather than escaping through the hole in the center of the detector. The charged particle beam system directs a beam of primary charged particles towards a target surface in a target vacuum chamber that emits secondary charged particles.

Embodiments of the invention can extend the life of the detector by spreading the detected particles more uniformly over a portion of the detector. The polarity of grid biasing can be reversed in order to take advantage of the unused half of the detector. This allows for the doubling of the surface area of the detector that can be used.

FIG. 1 illustrates a problem with prior art detectors. The secondary particles 116 that are generated from high aspect ratio hole 114 used in circuit edit are generally directed straight upwards. The general pathway of many of these secondary particles 116 will shoot up towards the original charged particle column 102 back through the on-axis hole 113 thereby missing the annular MCP detector 120.

The problem of poor collection efficiency is exacerbated at low beam currents, when fewer secondary particles are generated. Other applications are also ideal for the use of split-grid MCP detectors, such as Mask Repair systems, which use MCP detectors and operate at very low beam currents. Because of the low beam currents, the increase in collection efficiency of the secondary particles aids in the overall performance of the Mask Repair system.

Figure 2:
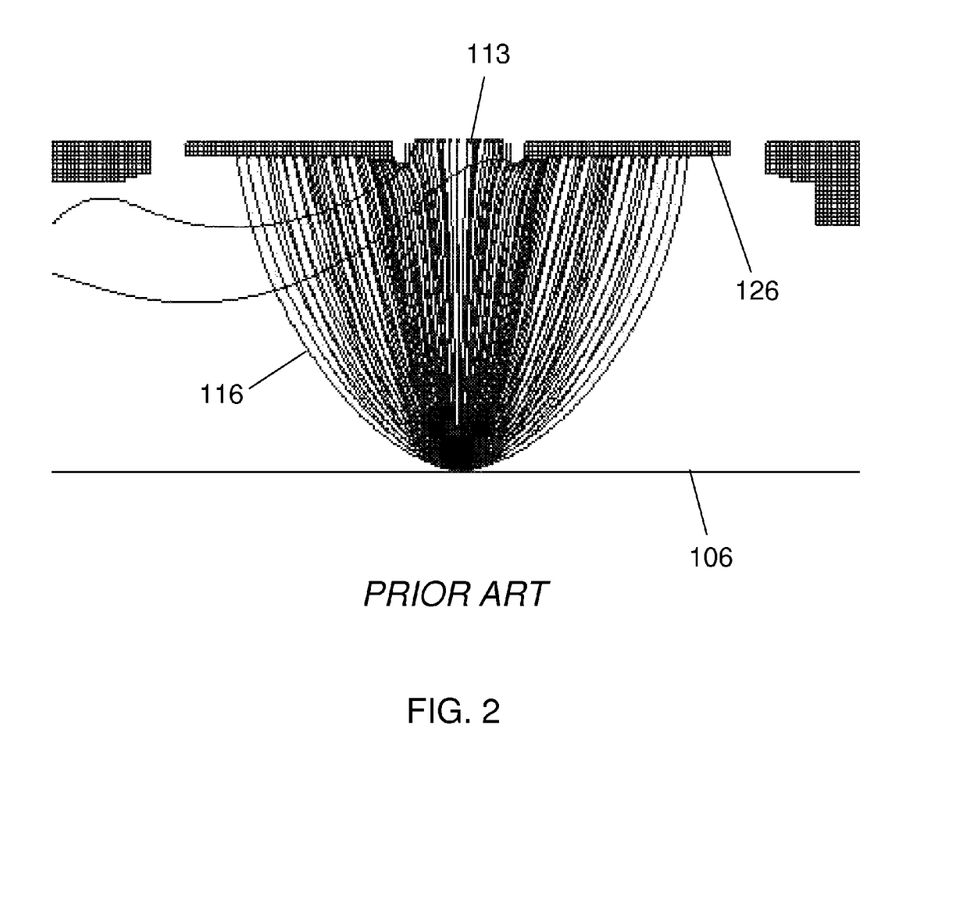
FIG. 2 is a simulation of electron trajectories as seen from a side view of a prior art MCP annular detector illustrating the substantial loss in collection efficiency due to the large number of particles that go up through the on-axis hole in the MCP.

FIG. 2 is a simulation of electron trajectories as seen from a side view of a prior art MCP annular detector. Grid 126 has a consistent voltage bias of 150V throughout the annular ring. The majority of the secondary particles 116 that are emitted from the target 106 are directed upwards on-axis through the on-axis hole 113. These secondary particles 116 are essentially lost and cannot be detected.

Figure 3:
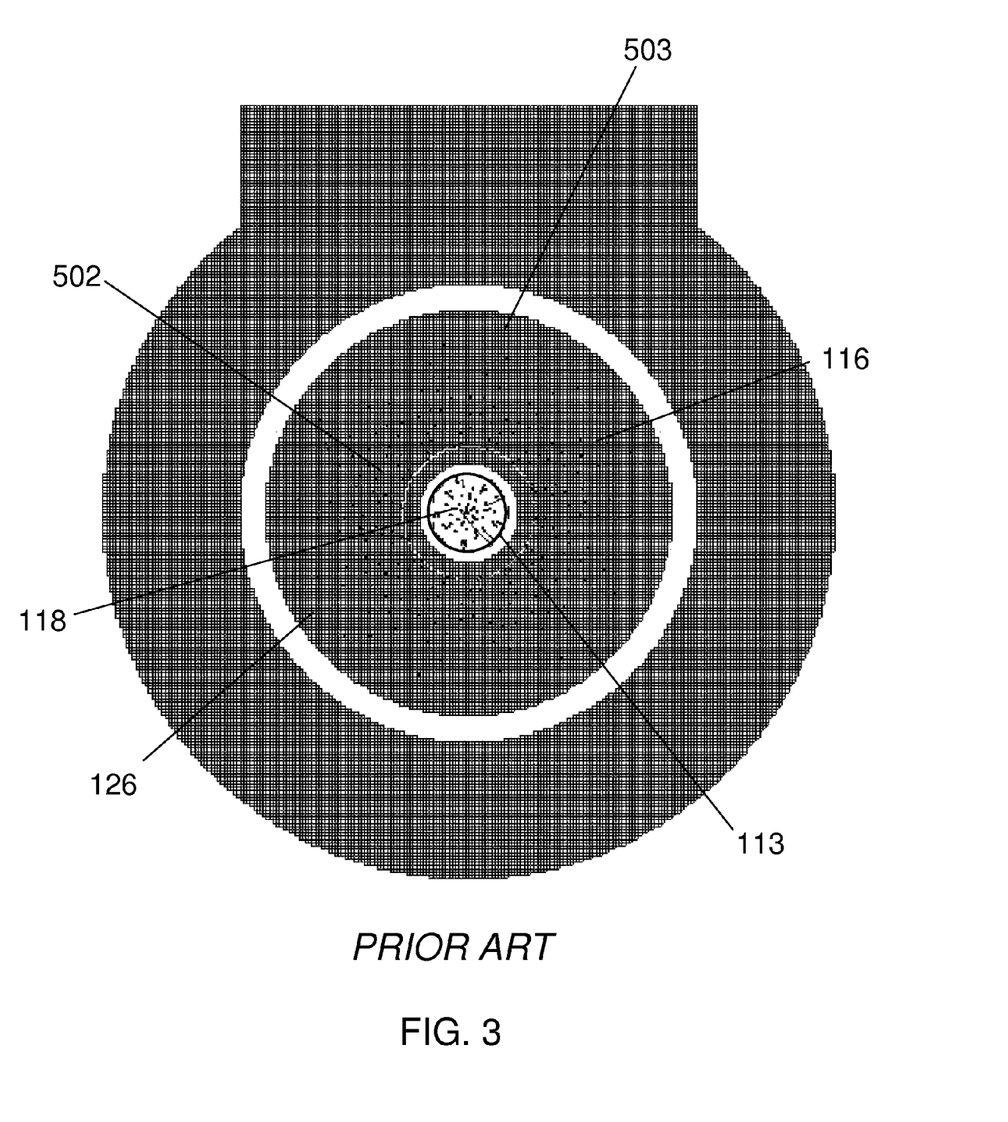
FIG. 3 is a simulation of electron impacts as seen by the bottom view of the same prior art MCP annular detector.

FIG. 3 is a simulation of electron impacts as seen by the bottom view of the same prior art MCP annular detector. The annular MCP detector grid 126 generally contains a circumferentially even voltage bias, generally around 150V, that does not alter the radial symmetry of the secondary particles 116 trajectories. As shown by the figure, the concentration of electron dose 502 surrounds the on-axis hole 113 of the MCP detector. And as can be seen, a substantial number of secondary particles 118 go up through the on-axis hole 113. Essentially no trajectories land at the outer edge 503 of the MCP detector.

Figure 4:
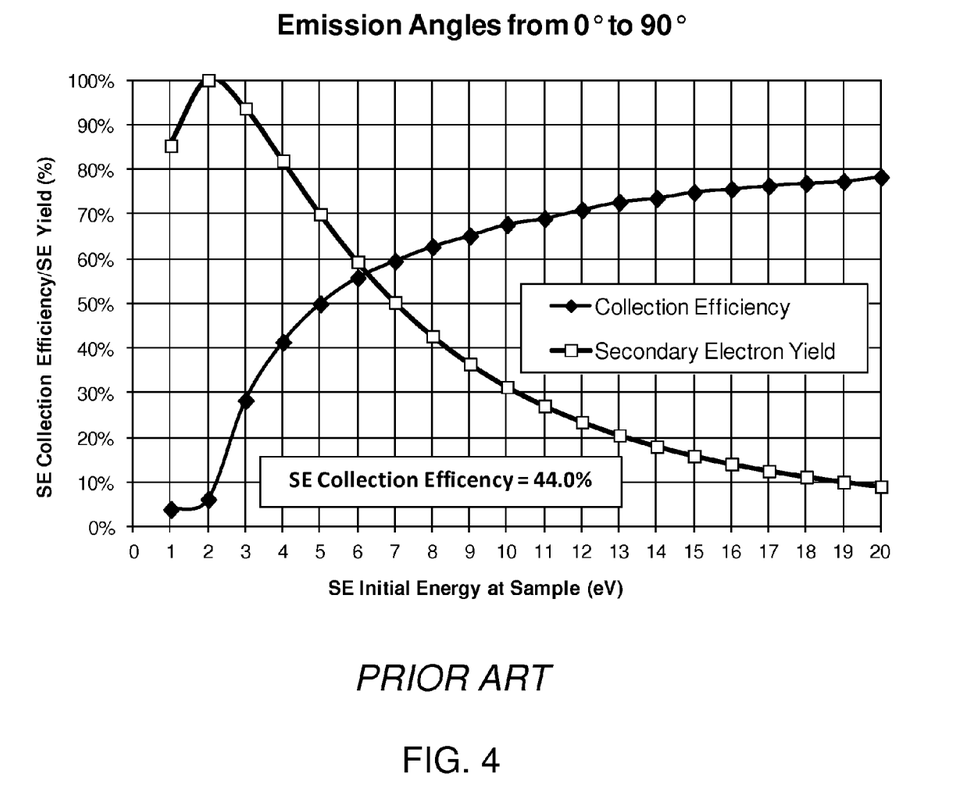
FIG. 4 is a graph of both the secondary electron collection efficiency and secondary electron yield plotted against secondary electron initial energy at emission angles from 0° to 90° for the prior art MCP detector in FIGS. 2 and 3.

FIG. 4 is a graph of both the secondary electron collection efficiency and secondary electron yield plotted against secondary electron initial energy at emission angles from 0° to 90° for the prior art MCP detector in FIGS. 2 and 3. The total collection efficiency for all secondary electron emission angles from 0° to 90° is 44%. The total collection efficiency is calculated by: multiplying the secondary electron collection efficiency times the secondary electron yield at each energy from 1 to 20 eV and then adding these products to form a first sum, adding the secondary electron yields at each energy from 1 to 20 eV to form a second sum, then dividing the first sum by the second sum.

Figure 5:
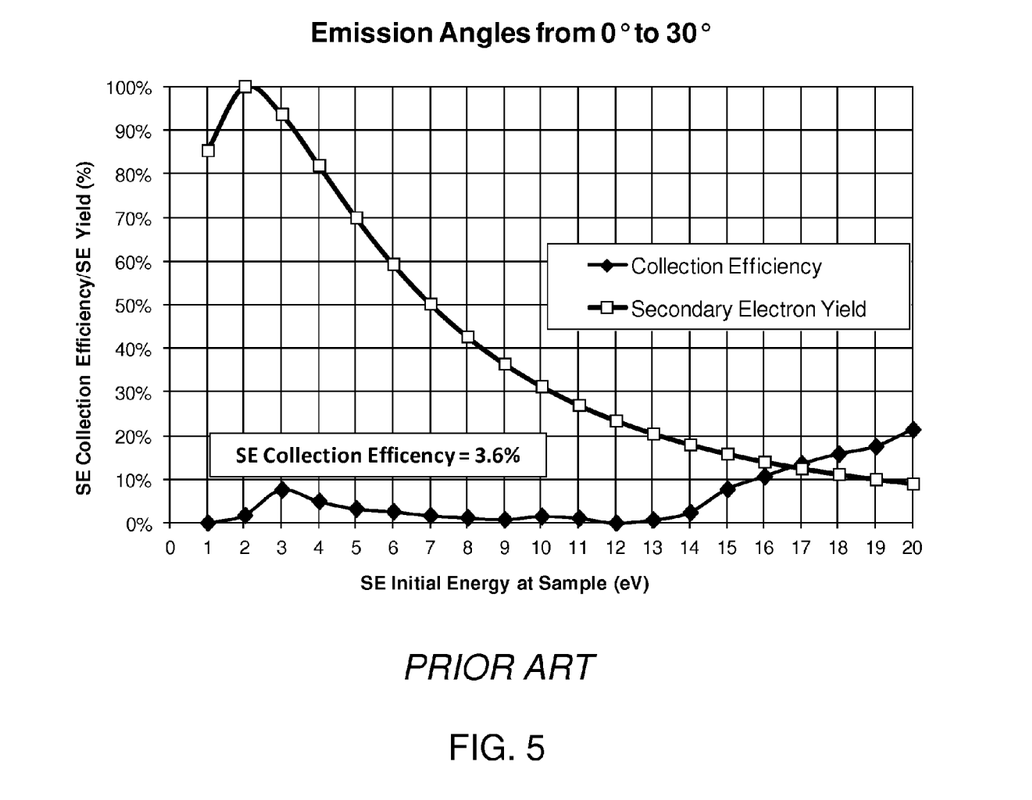
FIG. 5 is a graph of both the secondary electron collection efficiency and secondary electron yield plotted against secondary electron initial energy at emission angles from 0° to 30° for the prior art MCP detector in FIGS. 2 and 3.

FIG. 5 is a graph of both the secondary electron collection efficiency and secondary electron yield plotted against secondary electron initial energy at emission angles from 0° to 30° for the prior art MCP detector in FIGS. 2 and 3. The total collection efficiency for all secondary electron emission angles from 0° to 30° is only 3.6%. This corresponds to very poor imaging of the bottoms of high aspect ratio holes where only small angle secondary electron emissions escape the hole, such as those found in circuit edit.

Figure 6:
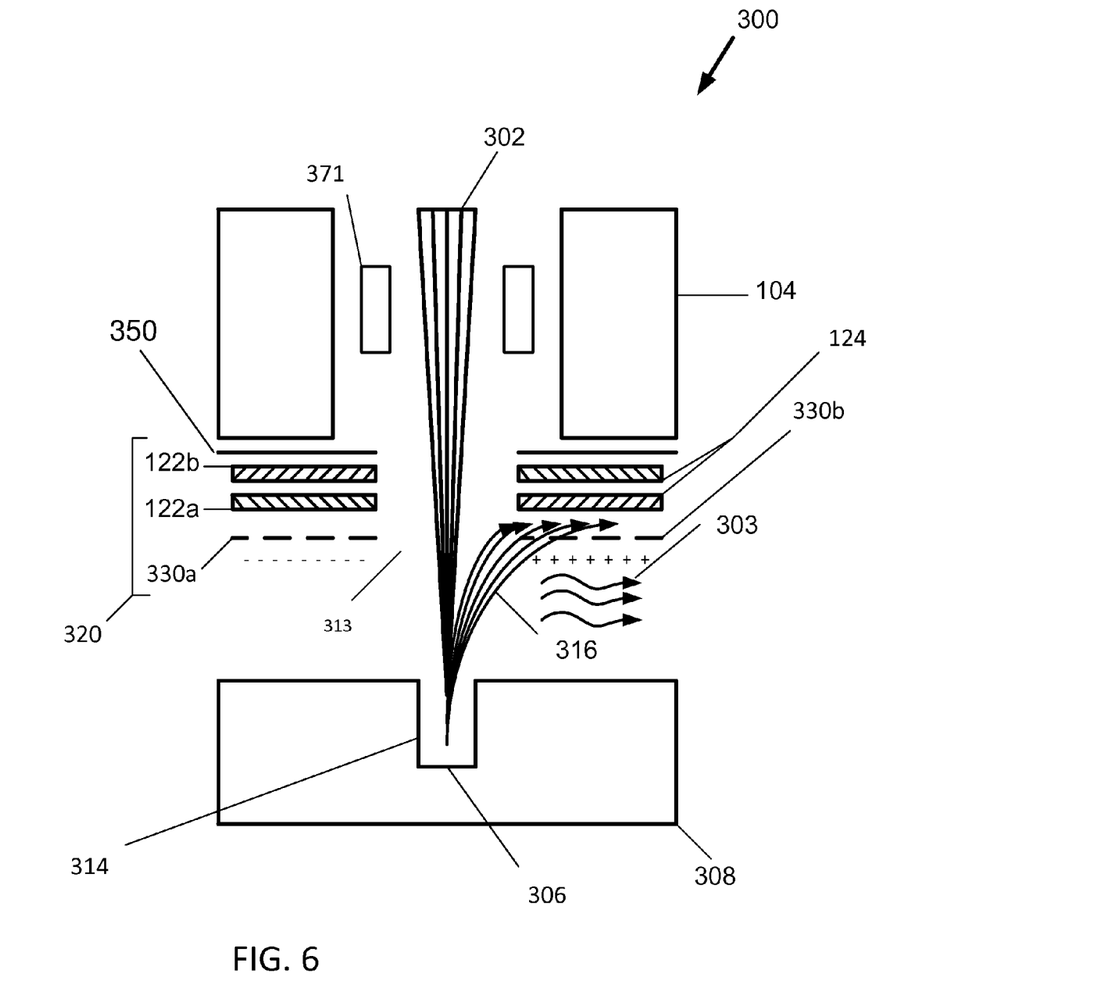
FIG. 6 shows schematically the invention of the charged particle beam system that uses the split-grid MCP detector.

FIG. 6 shows schematically the invention of the charged particle beam column 300 that uses the split-grid MCP detector 320 comprising entrance grids 330a and 330b, multichannel plates 122a and 122b, and collection plate 350. The split-grid MCP detector 320 contains grid 330a and grid 330b, wherein a charged particle beam 302 is sent through on-axis hole 313 onto a target 306 located in the high aspect ratio hole 314 within target 308. An electric field 303 is created by the different voltage bias of grids 330a and 330b. The secondary particles 316 that are emitted from the high aspect ratio hole 314 are deflected by the electric field 303, which allows for the secondary particles to hit the plate 122a rather than following a trajectory back through the on-axis hole 313. The detection of the secondary particles 316 on plate 122a allows for higher detection efficiencies on account that these secondary particles 316 are not lost. The reason that the charged particle beam 302 passes relatively undeflected down to target 306 is that the energy of the beam 302 is typically thousands of eV, while the energies of the secondary electrons 316 are less than 50 eV. Typical repelling voltages on grid 330a could range from −500V to 0V when the detector is used to collect secondary electrons, and optimally −75V; typical attracting voltages on grid 330b could range from 0V to +500V when the detector is used to collect secondary electrons, and optimally around +150V. When the detector is used to collect secondary ions, the repelling voltages on grid 330a and 330b will generally be higher to accommodate for the higher charged particles. The voltages on grid 330a can have a range from −2000V to 0V and grid 330b can have a range from 0V to +2000 V. Bias voltages on the entrance to multichannel plate 122a can range from +80V to +400V, and optimally around +200V. Voltages on the exit from multichannel plate 122b may range from +1500 to +2500V, and optimally around +2000V. Voltages on collection plate 350 may range from +1550 to +2550V, and optimally around +2100V.

Because of the electric field 303, the pathway of the charged particle beam 302 is slightly altered, typically by no more than a few tens of microns at the surface of target 308. In another embodiment of the invention, a deflection compensator 371 is incorporated to redirect the pathway of the charged particle beam 302. The deflection compensator 371 is used to counter the deflection of the charged particle beam 302 by the horizontal electric field 303. The deflection compensator 371 can be composed of an electrostatic deflector or a magnet capable of counter-deflecting the pathway.

Figure 7:
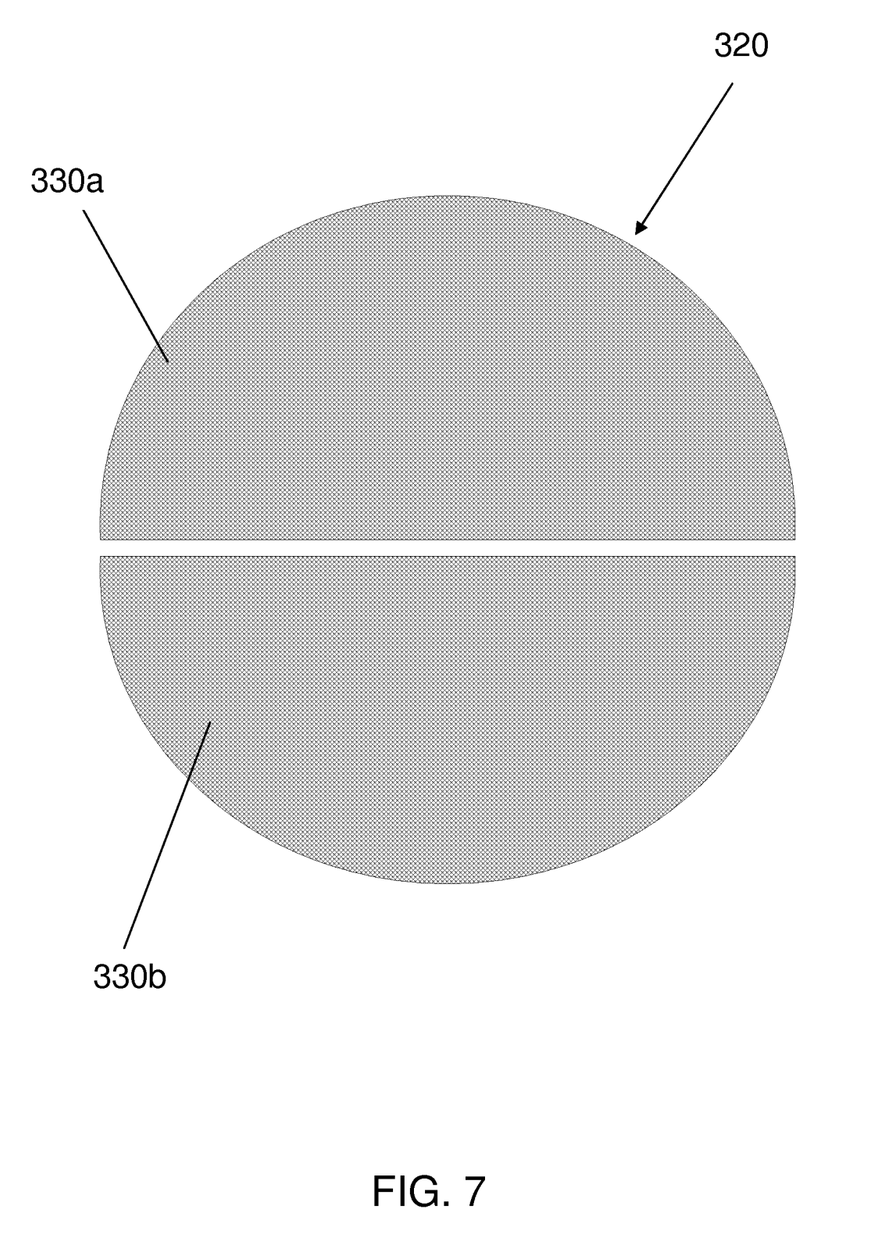
FIG. 7 shows schematically a split-grid for a microchannel plate detector.

FIG. 7 shows split detector grids 330a and 330b in accordance with one or more embodiments of the present invention. The face of the grid 330a and grid 330b is used to create an electric field 303 and deflects the secondary electrons 316 towards grid 330b. An independent voltage bias between negative 500V and positive 500V can be applied to grids 330a and 330b. The electric field 303 acts to steer all secondary particles to one half of the MCP detector, or in this embodiment, one of the two grids.

The voltage bias of grids 330a and 330b are independent and varied so that the electric field 303 is strong enough to alter the pathway trajectories of the secondary electrons 316. The difference in the voltage can be achieved in a variety of ways. One grid can have a positive voltage in the range of positive 1 to 500V relative to the target, while the other grid has a negative voltage in the range of the negative 1 to negative 500V. Both voltage bias of each grid can be either positive or negative as long as the difference in the voltages is strong enough to create electric field 303 that would alter the pathway trajectories of the secondary electrons. In another embodiment, grids 330a and 330b can be composed of one grid with the ability to maintain different voltage bias in different regions of the grid. In another embodiment, it is possible for one or more grid voltages to be at substantially 0 V (where the target bias voltage is also 0 V). The application of having only one grid with a positive or negative bias voltage could also create an electric field that would allow the steering of the secondary particles 316. It should also be noted that the steering of the secondary particles can also be directed to a different location other than one of the split grids. The source of the deflecting field does not need to be a potential applied to components of the detector; any source of a magnetic or electric field that deflects the secondary particles away from hole 313 can be used.

In another embodiment of the current invention, the voltage bias on grids 330a and 330b can be reversed such that the direction of electric field 303 can be reversed. By reversing the direction of the electric field 303, the secondary particles 316 that would have normally been detected on one side of detector 320 can now directed and detected on the other side of detector 320. The use of a separate grid allows for the ability to double the usage area of the detector, which enables the extension of life of the detector as a whole.

Figure 8:
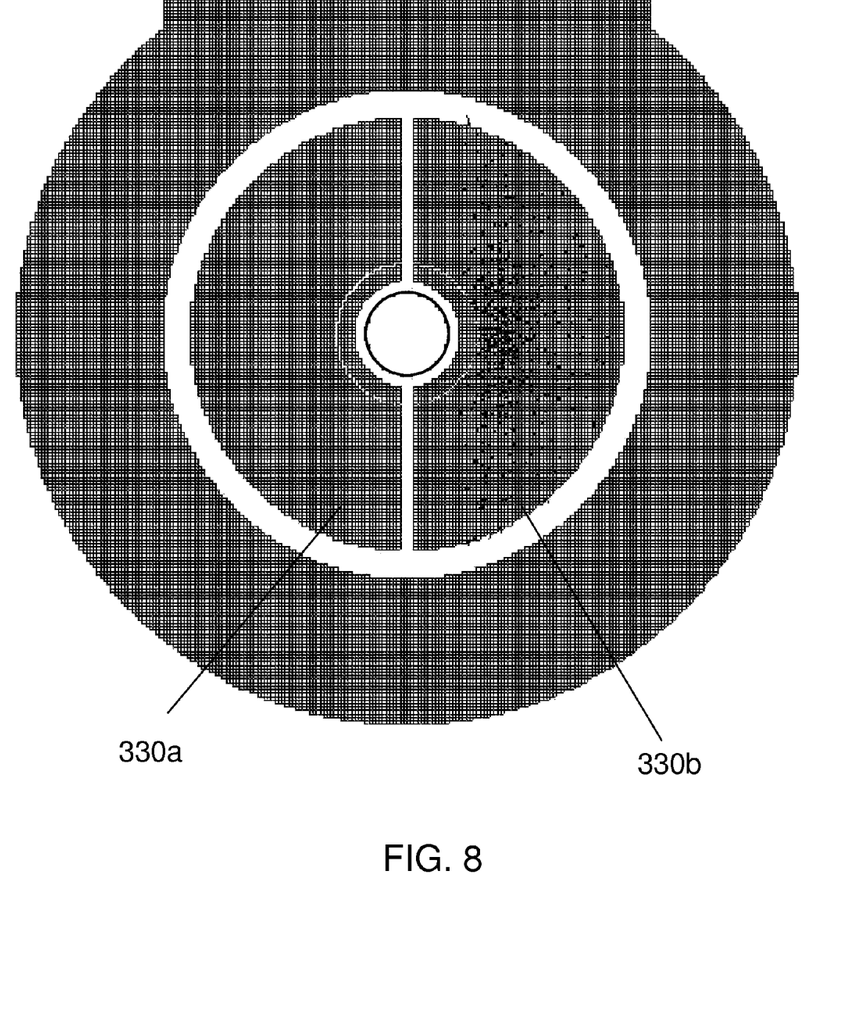
FIG. 8 is a simulation of electron impacts as seen from the bottom view of the split-grid MCP detector grid shown in FIGS. 6 and 7.

FIG. 8 is a simulation of electron trajectories as seen from the bottom view of the split-grid MCP detector grid shown in FIGS. 6 and 7. Because of the electric field created by the voltage bias differences between split grids 330a and 330b, nearly all the secondary particle trajectories land on the half of the MCP behind right grid 330b. Because the secondary electron trajectories are steered towards one direction, a single half of the detector can be used for detection, leaving the detector portion behind second grid 330a unused for detection. By comparison, the secondary electron trajectories of a prior art single grid MCP detector land in a annular concentration near the center hole while the secondary particles of this present embodiment land over a much wider radius enabling longer MCP detector lifetimes.

Figure 9:
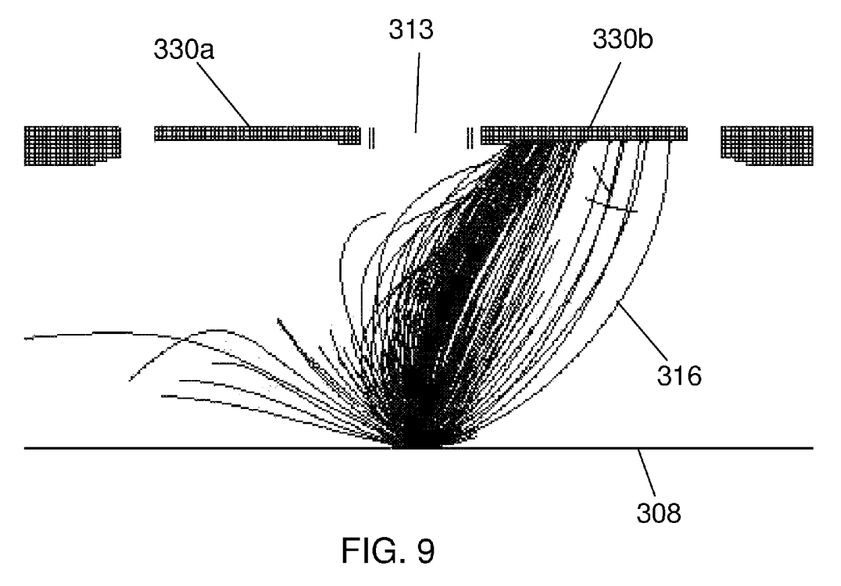
FIG. 9 is a simulation of electron trajectories as seen from the side view of the split-grid MCP detector grid shown in FIGS. 6 and 7.

FIG. 9 shows the simulation of electron trajectories of FIG. 8, but as seen from the side view of the split grid detector shown in FIGS. 6 and 7. Unlike the annular detector 120 as described in prior art, hardly any secondary particles, if any at all, go up through the on-axis hole 313. The simulation is performed having the half grid 330b at a voltage bias of positive 150V and the voltage bias of the second grid 330a at negative 75V. In this simulation, the horizontal electric field is strong enough to alter the trajectories of the low energy secondary particles to the right.

Figure 10:
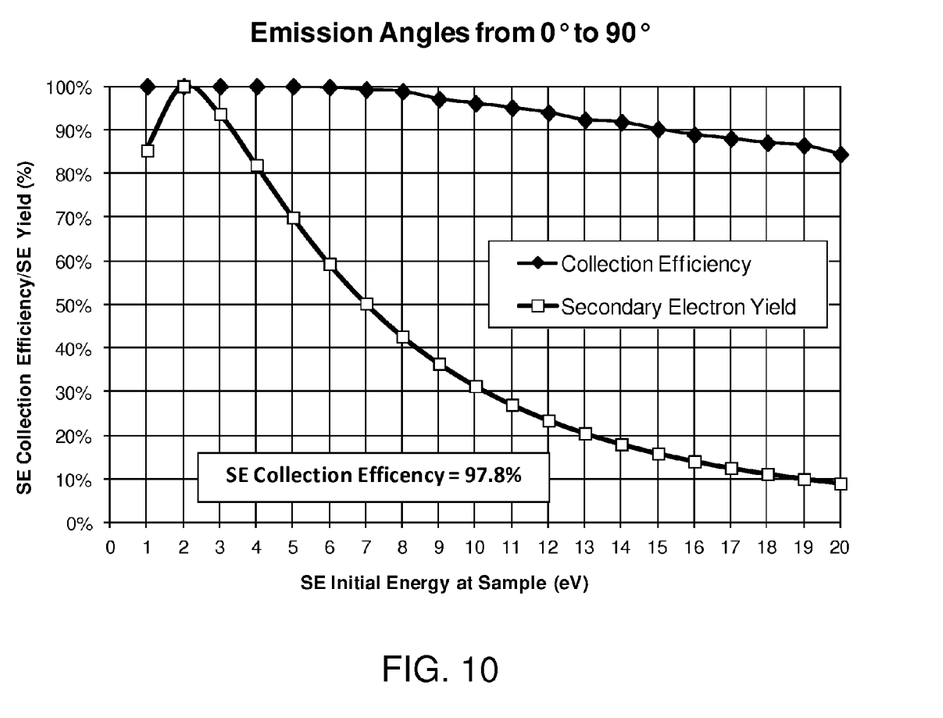
FIG. 10 is a graph of the secondary electron collection efficiency and secondary electron yield plotted against secondary electron initial energy at emission angles from 0° to 90° for the split-grid MCP detector in FIGS. 6 and 7.

FIG. 10 is a graph of both the secondary electron collection efficiency and secondary electron yield plotted against secondary electron initial energy at emission angles from 0° to 90° for the split-grid MCP detector in FIGS. 6 and 7. The total collection efficiency for all secondary electron emission angles from 0° to 90° is 97.8%—this is calculated as described in FIG. 4, above.

Figure 11:
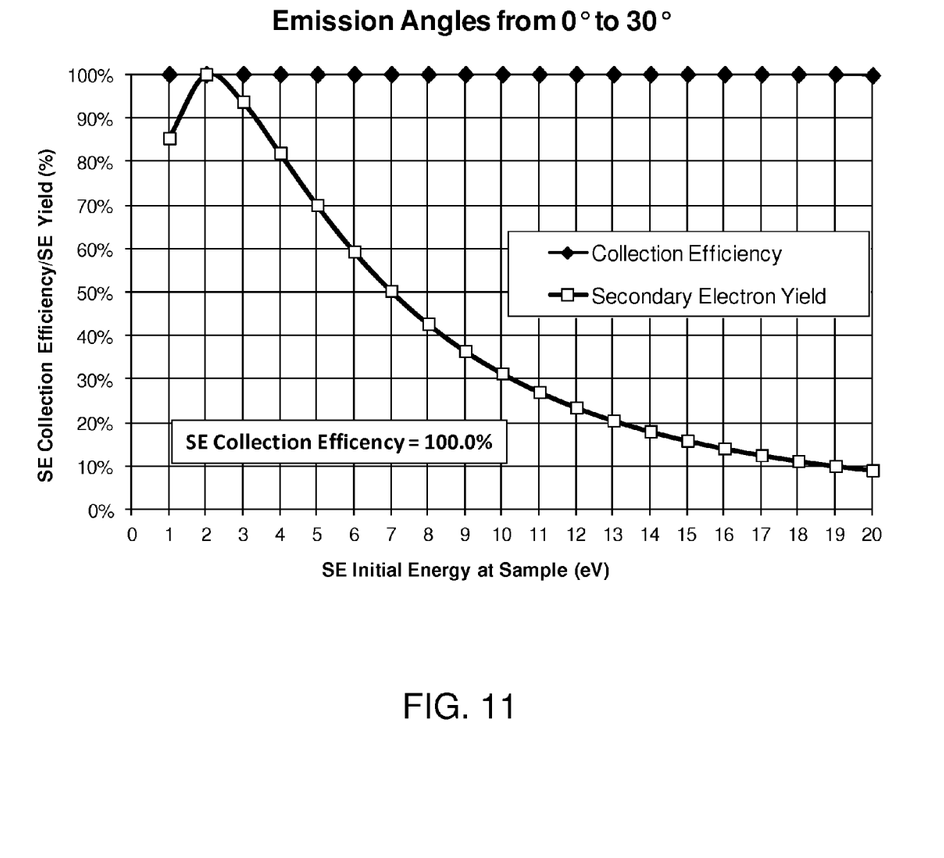
FIG. 11 is a graph of the secondary electron collection efficiency and secondary electron yield plotted against secondary electron initial energy at emission angles from 0° to 30° for the split-grid MCP detector in FIGS. 6 and 7.

FIG. 11 is a graph of both the secondary electron collection efficiency and secondary electron yield plotted against secondary electron initial energy at emission angles from 0° to 30° for the split-grid MCP detector in FIGS. 6 and 7. The total collection efficiency for all secondary electron emission angles from 0° to 30° is 100%. This corresponds to the best possible imaging of the bottoms of high aspect ratio holes such as those found doing circuit edit.

Figure 12:
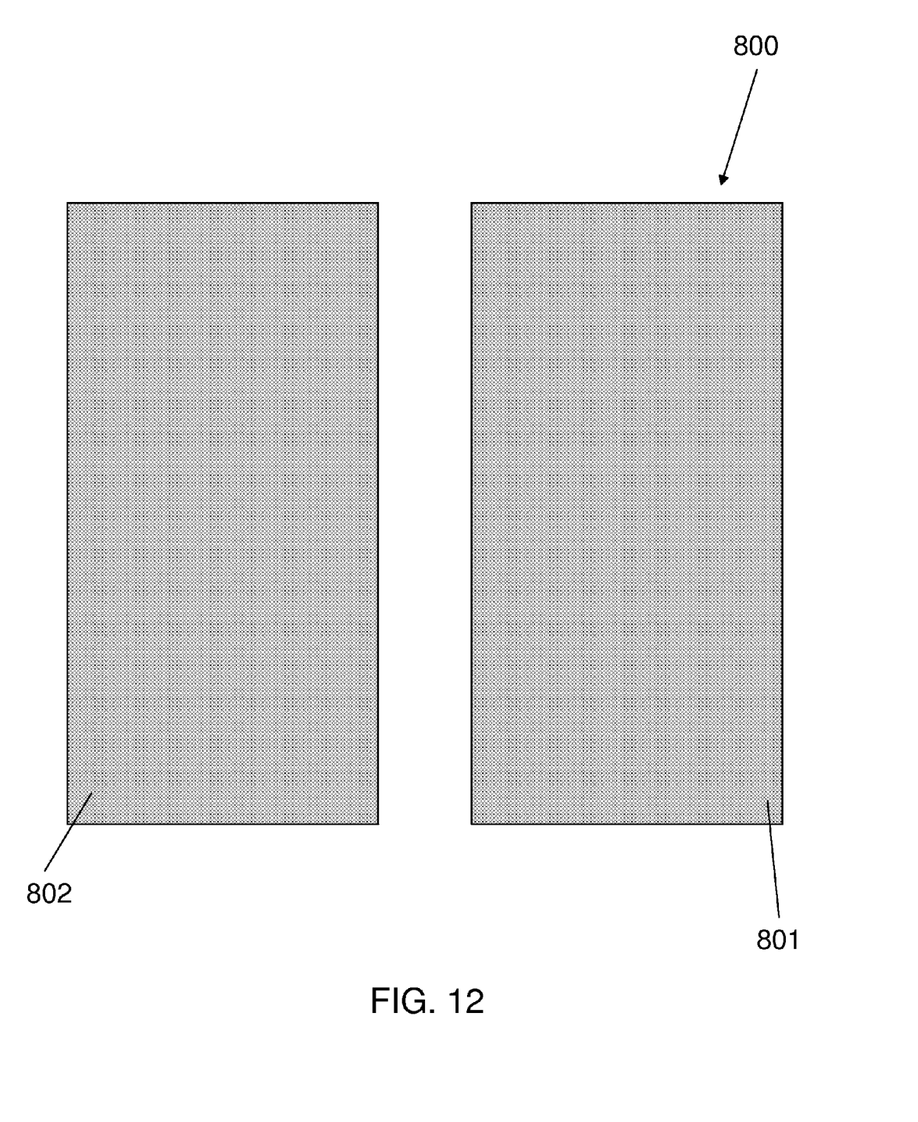
FIG. 12 shows schematically a split-grid for an MCP detector comprised of two similarly shaped rectangular grids.

FIG. 12 shows another embodiment of a split-grid system 800 wherein the split grids are composed of rectangular shapes. In this example, the first rectangular grid 801 is essentially the same size and shape as the second rectangular grid 802. Both grids 801 and 802 have the capability to have various voltage bias settings allowing for the split configuration to create the electric field necessary to alter the trajectory of the secondary particles to one side. Other non-circular shapes and sizes are possible and are currently contemplated. Also, by changing the voltage bias of the grids 801 and 802, it is possible to change the polarity of the grids such that secondary particles can be directed to the opposite grid. This allows for both grids 801 and 802 to be used reversibly, which essentially doubles the lifetime of the detector.

Figure 13:
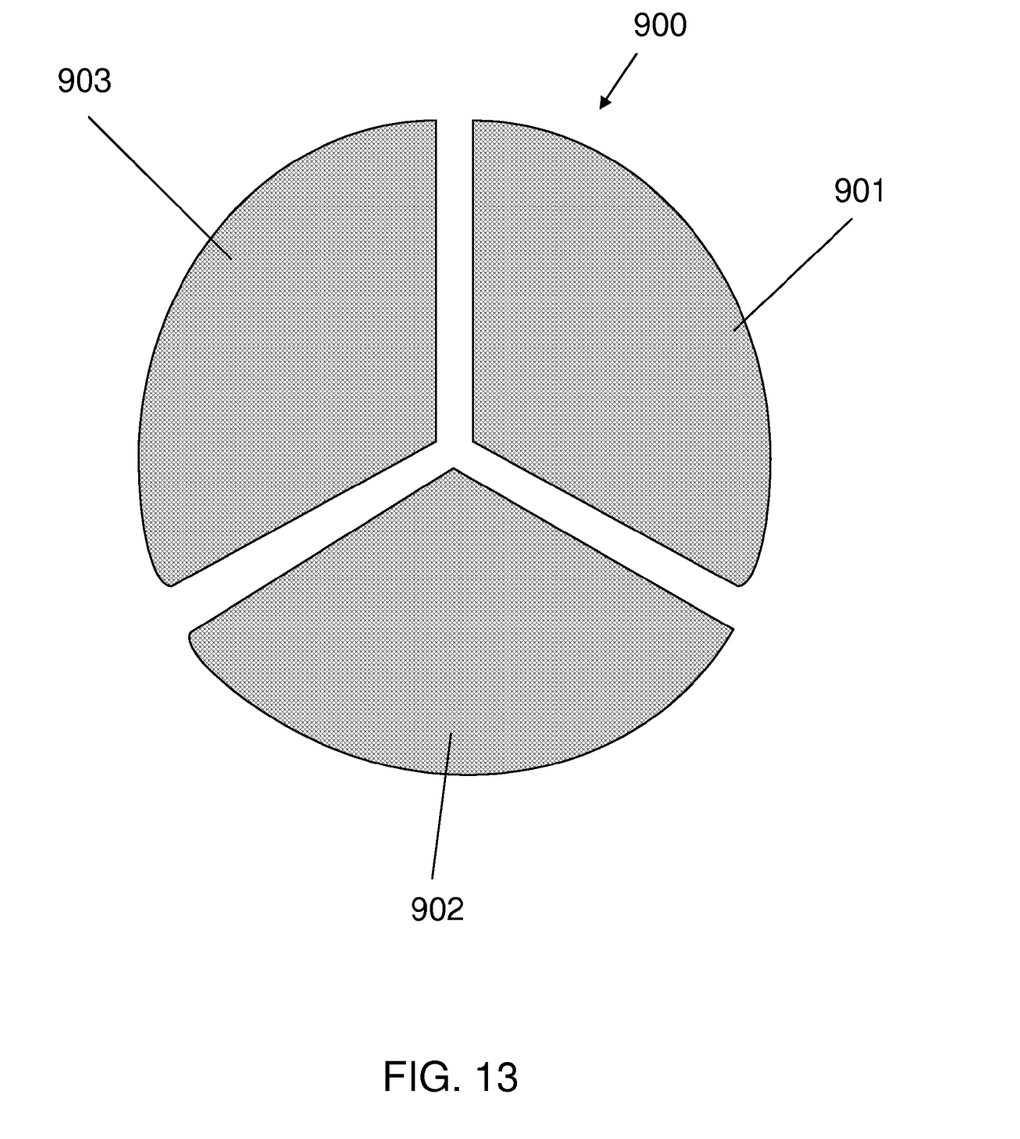
FIG. 13 shows schematically a split-grid for an MCP detector comprised of three grids.

FIG. 13 shows a schematic diagram of a split-grid detector grid system 900 comprised of three grids 901, 902, and 903. They can all be equal sized sections, each section subtending 120° circumferentially. The grids do not have to be equal sized. They can all have different angular shapes, such as 110°, 110°, and 140° circumferential angular shapes, with preferably the total being substantially equal to 360°. It is also possible to have more than 3 grids. Other configurations with N number of grids are also possible, wherein N is 4, 5, 6, etc. . . . Each grid section 901, 902, and 903 has the potential to maintain independent and different bias voltages as discussed above, which allows for the creation of different electromagnetic fields. The creation of different electric fields can alter the pathway of secondary particles, which allows for variations of a user's ability to steer the secondary particles and allows for different collection efficiencies.

Although embodiments of the present invention and their advantages have been described in detail, it should be understood that various changes, substitutions and alterations can be made to the embodiments described herein without departing from the spirit and scope of the invention as defined by the appended claims. Other systems, such as Mask Repair systems, which use detectors to operate with very low beam currents, are contemplated. The voltage source for the grids may come from a single power source and use a voltage divider, separate power sources for each grid, or some combination of voltage drivers and power sources. The bias voltages that are described above are typically DC bias voltages. While the examples provide an electric field to alter the trajectories of the secondary particles, a magnetic field could be used, although the effect of the magnetic field on the primary beam must be considered. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
   a source of charged particles forming a charged particle beam;
   a focusing column for focusing the charged particle beam onto a target;
   a vacuum chamber containing a target stage for holding the target;
   an on-axis secondary particle detector having an on-axis hole for passage of the charged particle beam and a detection portion;
   a field source positioned between the target stage and the particle detector, the field source providing a field to deflect secondary particles away from an on-axis hole in the secondary particle detector and onto the detection portion; and wherein the field source comprises:
      a first grid segment for being maintained at a first bias voltage, and
      a second grid segment for being maintained at a second bias voltage, the voltage difference between the first grid segment and the second grid segment creating an electric field above the target stage.

2. The charged particle beam system of claim 1 in which the first grid segment and the second grid segment are separated.

3. The charged particle beam system of claim 1 in which the first grid segment has a positive bias voltage and the second grid segment has a bias voltage that is substantially zero.

4. The charged particle beam system of claim 1 in which the first grid segment has a bias of between negative 500V and 0V and the second grid segment has a bias of between 0V and positive 500V.

5. The charged particle beam system of claim 1 in which the secondary particle detector includes an ion-to-electron converter.

6. The charged particle beam system of claim 1 wherein the bias voltages of the first grid segment and the second grid segment are reversible.

7. The charged particle beam system of claim 1 wherein the bias voltages of the first grid segment and the second grid segment can be independently varied over a range of negative 500 V to positive 500 V.

8. The charged particle beam system of claim 1 in which the first grid segment and the second grid segment are semi-circular or rectangular.

9. The charged particle beam system of claim 1 in which the field source includes a third grid segment for being maintained at a third bias voltage, wherein the voltage differences between the first grid segment, the second grid segment, and the third grid segment create an electric field above the target stage.

10. A method of detecting secondary particles, comprising:
   directing a beam of primary charged particles toward a target surface in a target vacuum chamber;
   configuring a secondary particle detector to collect secondary charged particles emitted from the target surface upon impact of the beam of primary charged particles, wherein the detector is located above the target and wherein the detector is configured with a center hole to permit the primary charged particle beam to pass through;
   positioning a multiplicity of grids between the target and the secondary particle detector;
   applying a bias voltage to each grid of the multiplicity of grids to create an electric field above the target within the target vacuum chamber to direct the secondary particles towards one or more of the grids in the multiplicity of grids;
   detecting the secondary particles which have passed through the one or more of the grids in the multiplicity of grids.

11. The method of claim 10 in which directing the beam of primary charged particles toward the target surface in the target vacuum chamber includes directing an ion beam or an electron beam.

12. The method of claim 10 in which the secondary particles that are collected by the secondary particle detector are secondary electrons.

13. The method of claim 12 in which the secondary particles comprise on-axis electrons that are not detected by the secondary particle detector when there is no electric field in the vacuum chamber.

14. The method of claim 10 in which the bias voltage of each grid of the multiplicity of grids is between negative 500V and positive 500V such to alter the electric field in the vacuum chamber.

15. The method of claim 10 in which the bias voltage of each grid of the multiplicity of grids can be changed to direct the secondary particles towards any one or more of the grids in the multiplicity of grids.

16. The method of claim 10 in which the primary charged particle beam is deflected by the electric field created in the vacuum chamber and there is a counter-deflection mechanism to compensate for the deflection of the primary charged particle beam.

17. The method of claim 10 in which the secondary particles that are collected by the secondary particle detector are secondary ions.

18. The method of claim 17 in which the secondary particles comprise on-axis ions that are not detected by the secondary particle detector when there is no electric field in the vacuum chamber.

19. The method of claim 17 in which the bias voltage of each grid of the multiplicity of grids is between negative 2000V and positive 2000V such to alter the electric field in the vacuum chamber.

* * * * *